United States Patent [19]

Chevalier

[11] Patent Number: 4,845,673
[45] Date of Patent: Jul. 4, 1989

[54] DYNAMIC MEMORY WITH SINGLE-CYCLE WRITING OF A FIELD OF LOGIC STATES

[75] Inventor: Christophe Chevalier, Paris, France

[73] Assignee: Thomson Semiconducteurs, Paris, France

[21] Appl. No.: 12,484

[22] Filed: Feb. 9, 1987

[30] Foreign Application Priority Data

Feb. 18, 1986 [FR] France .................. 86 02183

[51] Int. Cl.[4] .................................... G11C 11/24
[52] U.S. Cl. ........................ 365/149; 365/189.9
[58] Field of Search ............... 365/149, 189, 203, 222

[56] References Cited

U.S. PATENT DOCUMENTS

| | | | |
|---|---|---|---|
| 4,259,729 | 3/1981 | Tokushige | 365/149 |
| 4,491,936 | 1/1985 | Eaton et al. | 365/149 |
| 4,593,382 | 6/1986 | Fujishima et al. | 365/149 |

FOREIGN PATENT DOCUMENTS 0144710 6/1985 European Pat. Off. .

OTHER PUBLICATIONS

IBM Technical Disclosure Bulletin, vol. 27, No. 6, Nov. 1984, pp. 3469–3470, New York, U.S.; P. Nack et al.; "Substrate Voltage Bump Test for Dynamic Ram Memory Devices".

Research Disclosure, No. 254, Jun. 1985, p. 290, No. 25423, Emsworth, Hampshire, GB; "1D Cell Memory System with Pulsed Storage Plate for Multiplexed Bit Lines".

Primary Examiner—Joseph A. Popek
Attorney, Agent, or Firm—Oblon, Spivak, McClelland, Maier & Neustadt

[57] ABSTRACT

The present invention pertains to a dynamic memory. The voltage of the hot spot of the storage capacitor is carried to a value such that all the cells comprise the same logic value, owing to a potential generator. It is thus possible to write and read bit fields on a large-capacity memory at high speed. This device has applications with respect to image memories and for manufacturing tests.

2 Claims, 1 Drawing Sheet

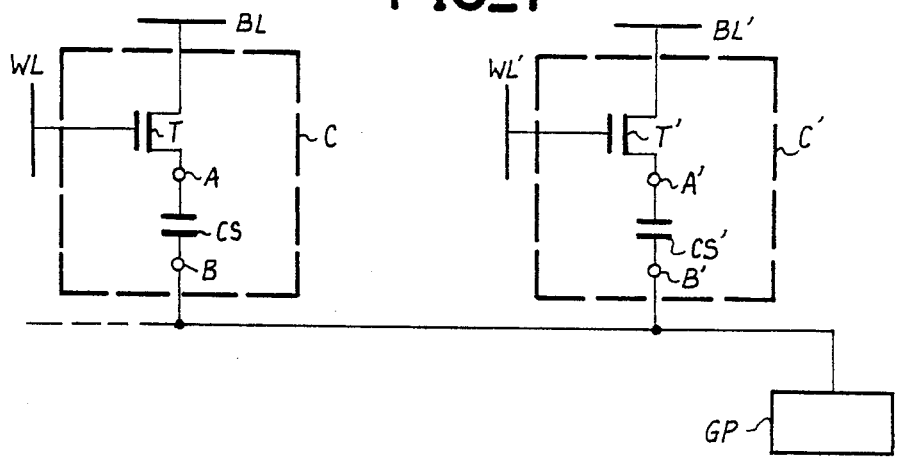
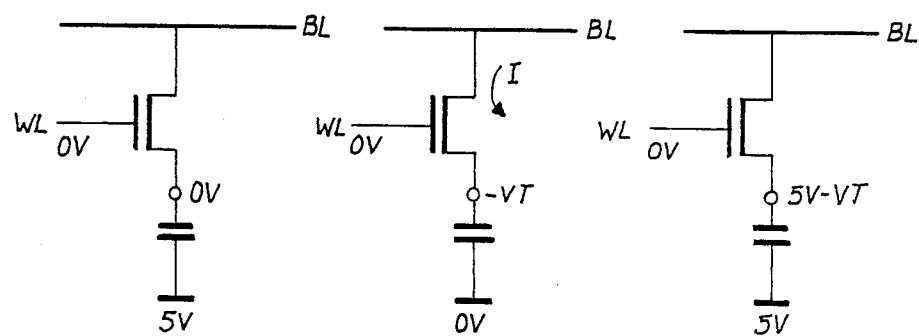

4,845,673

DYNAMIC MEMORY WITH SINGLE-CYCLE WRITING OF A FIELD OF LOGIC STATES

BACKGROUND OF THE INVENTION

Field of the Invention

The invention pertains to a dynamic memory with single-cycle writing of a field of logic states. It finds application in the setting up of large-capacity memory units which may be isolated or integrated into a central processing unit.

In the prior art, a dynamic memory, to be charged, first has to be addressed, and then a logic state is transmitted to the desired address. Thus, for an address cycle, only one address is accessible at a time. By increasing the number of the addressable rows, it is possible to increase the quantity of logic states entered in one cycle for a dynamic memory capacity, but the writing of a complete field is a long process. In particular, this arrangement is disadvantageous for the initialization of image memories used by graphic processors.

One of the aims of the present invention is to propose a special arrangement by which a field of bits of a given value can be written in a single writing cycle.

Furthermore, the invention cannot be identified with the approach that consists in increasing the number of the addressing means of the dynamic memory to increase the overall writing speed. On the contrary, as compared with this type of solution, the invention proposes a simpler and less expensive arrangement which does not take up much of the useful surface of silicon on the integrated circuit in which the dynamic memory of the invention is implanted.

Summary of the Invention

The invention pertains to a dynamic memory such that the storage capacitor of each memory cell is connected by a first terminal to a potential generator. This potential generator is designed, upon an command, to modify the potential of the other terminal of the storage capacitor by a quantity such that the information stored in each cell assumes a new value corresponding solely to the quantity by which the potential of the second terminal has been modified.

The invention can be advantageously used to initialize large-capacity memory units such as digital image memories.

BRIEF DESCRIPTION OF THE DRAWINGS

Other characteristics and advantages of the present invention will be better understood from the following description and drawings, of which:

FIG. 1 is a diagram of a pair of cells of a dynamic memory according to the invention.

FIGS. 2a, 2b, 2c are three figures describing the changing of potentials between a first state and a final state;

FIG. 3 is a diagram of an output circuit of a dynamic memory designed to be initialized as a whole unit.

DESCRIPTION OF THE PREFERRED EMBODIMENT

According to the invention, it is sought to put all the cells of a dynamic memory at one and the same physical level.

The capacitor of a cell comprises two conductors, A and B, and one dielectric, one of the conductors ("A" for example) preserving the charge. This charge is conveyed to the conductor A by a transistor. At rest, the transistor is off and the charge is stored.

The other conductor B is in normal operation at fixed potential. According to the invention, this potential is modified so as to shift the potential to the conductor A by capacitive coupling. Depending on its level, the potential at the conductor A is shifted so as cause the above-mentioned transistor to be on. The conductor B is then repositioned at its level in normal functioning. The potential of the conductor A, by coupling, will be shifted as much as the potential of the conductor B. The generator of potential (GP) is connected to a common conductor of each of the cells which provides for a sequence of potentials for a single writing action which will be discussed below.

First case: the transistor comes on during the first shift of the conductor B. The level stored then assumes a new value, related to the amplitude of the shift of the conductor B and to the electrode gate voltage and threshold voltage of the transistor.

Second case: the transistor stays off. The level stored follows the variations of B and returns to its first level, and the stored charge is preserved.

The shift of the conductor B should be such that the final variation in potential at the conductor A in the first case brings the potential of the conductor A to a level close to the potential of the second case.

The example of FIGS. 2a to 2c comprises a description of a cycle of operation undergone by a cell having the following characteristics: NMOS transistor, bit line precharging level equal to or greater than 0V, word line 0V, capacitor plate (conductor B) at 5V.

Cycle on conductor B: 5V to 0V to 5V (from the first state to the final state).

Cycle of stored level:

First case: the level stored at 5V comes down to 0V and rises again to 5V. No modification of level.

Second case: the level stored at 0V comes down towards −5V causing the transistor to be on, the potential of the conductor A moves to 0V−Vt.

When the potential at B returns to 5V, the potential at A goes to 5V−Vt (Vt=threshold voltage of transistor). The level stored in the memory cell is modified.

This shift of the conductor B is applied to the whole memory or to a part of it.

All the cells to which this cycle is applied are therefore at a level of 5V or 5V−Vt.

They are therefore at a similar physical level and will be read, depending on their locations, as one and the same logic level. The determination of this logic level, depending on the location, is examined in the second part.

In an advantageous use of the invention, it is sought to put all the cells of a dynamic memory at one logic level.

In a dynamic memory, the datum or the complemented datum is stored according to the address of the memory cell considered.

It suffices, depending on its address, to invert the complemented datum or to drive one of the amplifier stages by inverting the inputs of this stage to restore the datum at the output. This principle is commonly used in memory circuits. Therefore, in the following description, we consider that the level stored corresponds to a level to be output. Thus, in a standard memory, by storing a constant logic level throughout the memory, this level will be preserved at the output.

The device described in FIG. 3 can be used to read "1"s or "0"s on the basis of a constant physical level (5V for the example of FIG. 2). This device can be used to create two particular modes of the memory: the writing of a field of "0"s and the writing of a field of "1"s. These modes must be selected by a command indicating the logic level to be written. The command may be prepared by an internal circuit of the memory on the basis of control signals such as the selection signal or the initialization signal.

The device consists in the inverting or non-inverting of the input and output buffers depending on the desired logic level.

Thus, during the execution of the command for zeroizing the entire memory, for example, the memory is placed at the physical level 5V (the case of our example) and the data are inverted at the output. If a datum is written in the memory, it will be stored as an inverted datum to be re-inverted at the output when it is read.

These devices can be applied to dynamic memory cells with one or more transistors.

These devices can be applied to dynamic memory cells in packages or within more complex circuits.

The device for choosing "1"s or "0"s does not necessarily have to be integrated with the dynamic memory.

The discharge of the stored level during the coupling of the conductor B can be done either by the transistor turned on or by the direct polarizing of the transistor junction linked to the conductor A and by leakage into the substratum.

The invention thus makes it possible, for example, to:

Fill a memory unit with a logic level for each pixel (in the case of an image unit);

Initialize a memory;

Test a complete memory at the end of the manufacturing process in order to lower the cost of the final product because this test, since it is fast, can be applied to large batches;

Copy a register at a logic level on all the lines of an image memory (copy mode).

To charge the assignment of 1 or 0, there must be a selection of the mode "field of 1" or "field of 0". For this, a mode of embodiment of the command of the output inverters integrated with the memory has been described. These circuits may be implanted outside the memory circuit.

In one mode of embodiment, the dynamic memory is coupled with a microprocessor. The inverters are simulated by a suitable software programme.

In another mode of embodiment, the voltage of the substrate is used instead of that of the charge line BL to discharge the capacitor of the cell.

What is claimed is:

1. A dynamic RAM memory comprising:
    an array of memory cells, with each cell comprising a series arrangement of a transistor and a storage capacitor, said capacitor of each cell having a first plate connected to the transistor of the corresponding cell and a second plate, wherein each of said cells is capable of storing either a first quantity of charge corresponding to a first programming state or a second quantity of charge corresponding to a second programming state, wherein the second plate of the capacitor of the cells forming the array are connected to a common potential generator capable of being switched to supply either a first potential or a second potential;
    wherein said first potential is used during the individual reading or writing step of information of a given cell, with said potential generator being controlled so that in a single writing action of all cells, while the cells are not individually addressed, said generator first supplies said second potential to the second plates of said cells, in order to set in a conduction state of the transistors of each of the cells in said first state, thereby charging the capacitors of said cells to said second state, and then secondly supplying said first potential.

2. A dynamic memory cell according to claim 1, wherein means are provided for writing binary data in the cells of the array, said data being either a logic zero or a logic one, said logic zero and logic one each corresponding to one of said states of the cells, and further comprising:
    logic means capable of being controlled for inverting when desired the binary data prior to their application to the cells and means for inverting data read from the cells.

* * * * *